United States Patent
Halder et al.

(10) Patent No.: US 9,664,715 B2
(45) Date of Patent: May 30, 2017

(54) METHOD FOR MEASURING THE FREQUENCY OF AN ELECTRICAL SIGNAL AND AN ELECTRICAL MEASURING SYSTEM

(71) Applicants: Horst Siedle GmbH & Co. KG, Furtwangen (DE); Friedrich-Alexander-Universitaet Erlangen-Nuernberg, Erlangen (DE)

(72) Inventors: Ernst Halder, Stuttgart (DE); Peter Dingler, Aalen-Ebnat (DE); Francesco Barbon, Erlangen (DE); Alexander Kölpin, Bamberg (DE); Stefan Lindner, Erlangen (DE); Sarah Linz, Erlangen (DE); Sebastian Mann, Lauf a.d. Pegnitz (DE)

(73) Assignees: HORST SIEOLE GMBH & CO KG, Furtwangen (DE); FRIEDRICH-ALEXANDER-UNIVERSITAET ERLANGEN-NUREMBERG, Erlangen (DE)

( * ) Notice: Subject to any disclaimer, the term of this patent is extended or adjusted under 35 U.S.C. 154(b) by 171 days.

(21) Appl. No.: 14/268,008

(22) Filed: May 2, 2014

(65) Prior Publication Data
US 2014/0347035 A1    Nov. 27, 2014

(30) Foreign Application Priority Data
May 21, 2013    (DE) .................. 10 2013 209 364

(51) Int. Cl.
*G01R 23/02* (2006.01)

(52) U.S. Cl.
CPC .................................... *G01R 23/02* (2013.01)

(58) Field of Classification Search
CPC ............. G01R 23/02; H03B 5/18; H03B 5/24
See application file for complete search history.

(56) References Cited

U.S. PATENT DOCUMENTS

| | | | | |
|---|---|---|---|---|
| 4,104,583 A * | 8/1978 | Engen | .................... | G01R 27/04 324/638 |
| 4,888,567 A * | 12/1989 | Berger | .................... | H03B 5/36 331/116 R |
| 5,500,597 A * | 3/1996 | Tickell, Jr. | ............... | G01V 3/28 324/232 |
| 7,065,331 B2 * | 6/2006 | Korden | .................. | G06K 19/16 455/150.1 |
| 7,215,936 B2 * | 5/2007 | Sadowski | .............. | H03D 11/02 455/215 |

(Continued)

OTHER PUBLICATIONS

High Frequency VCO Design and Schematics (http://www.qsl.net/va3iul/High_Frequency_VCO_Design_and_Schematics/High_Frequency_VCO_Design_and_Schematics.htm).*

(Continued)

*Primary Examiner* — Son Le
*Assistant Examiner* — Alvaro Fortich
(74) *Attorney, Agent, or Firm* — Harness, Dickey & Pierce, P.L.C.

(57) ABSTRACT

Described is an electrical measuring system with a six-gate circuit and a delay line. An electrical signal is fed from a resonator, at least one of directly and or via the delay line, to the six-gate circuit. The frequency of the signal is computed by the six-gate circuit in dependence on the length of the delay line.

17 Claims, 5 Drawing Sheets

(56) References Cited

U.S. PATENT DOCUMENTS

| | | | | |
|---|---|---|---|---|
| 7,812,680 B1* | 10/2010 | Brown | ............... | H03C 3/42 |
| | | | | 331/116 M |
| 8,228,130 B1* | 7/2012 | Ivanov | ............... | H03B 5/364 |
| | | | | 331/107 A |
| 8,277,731 B2* | 10/2012 | Yorita | ............... | G01N 5/02 |
| | | | | 422/500 |
| 8,291,750 B1* | 10/2012 | Goodbread | ............... | G01N 11/16 |
| | | | | 73/54.41 |
| 2007/0296513 A1* | 12/2007 | Ruile | ............... | H03B 5/1841 |
| | | | | 331/116 R |
| 2008/0074206 A1* | 3/2008 | Matsumoto | ............... | G06F 1/08 |
| | | | | 331/158 |
| 2009/0267746 A1* | 10/2009 | Muchkaev | ............... | H04Q 9/00 |
| | | | | 340/10.4 |
| 2010/0265000 A1* | 10/2010 | Kishi | ............... | H03L 1/025 |
| | | | | 331/176 |
| 2010/0327996 A1* | 12/2010 | Klein | ............... | H01P 7/04 |
| | | | | 333/219.1 |
| 2011/0193572 A1* | 8/2011 | Gehrig | ............... | B65H 63/064 |
| | | | | 324/681 |

OTHER PUBLICATIONS

Molina-Fernandez, I. et al., "Multi-port Technology for Microwave and Optical Communications," IEEE, 2012.

\* cited by examiner

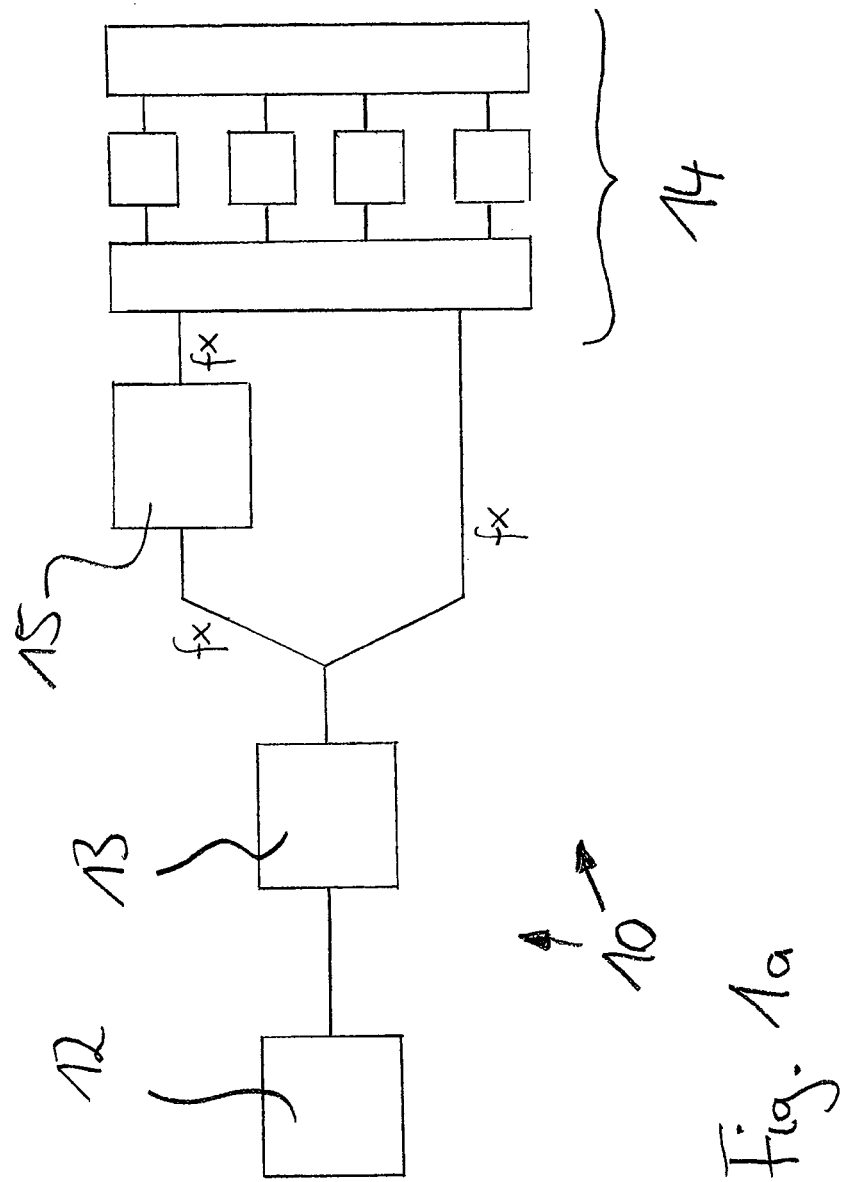

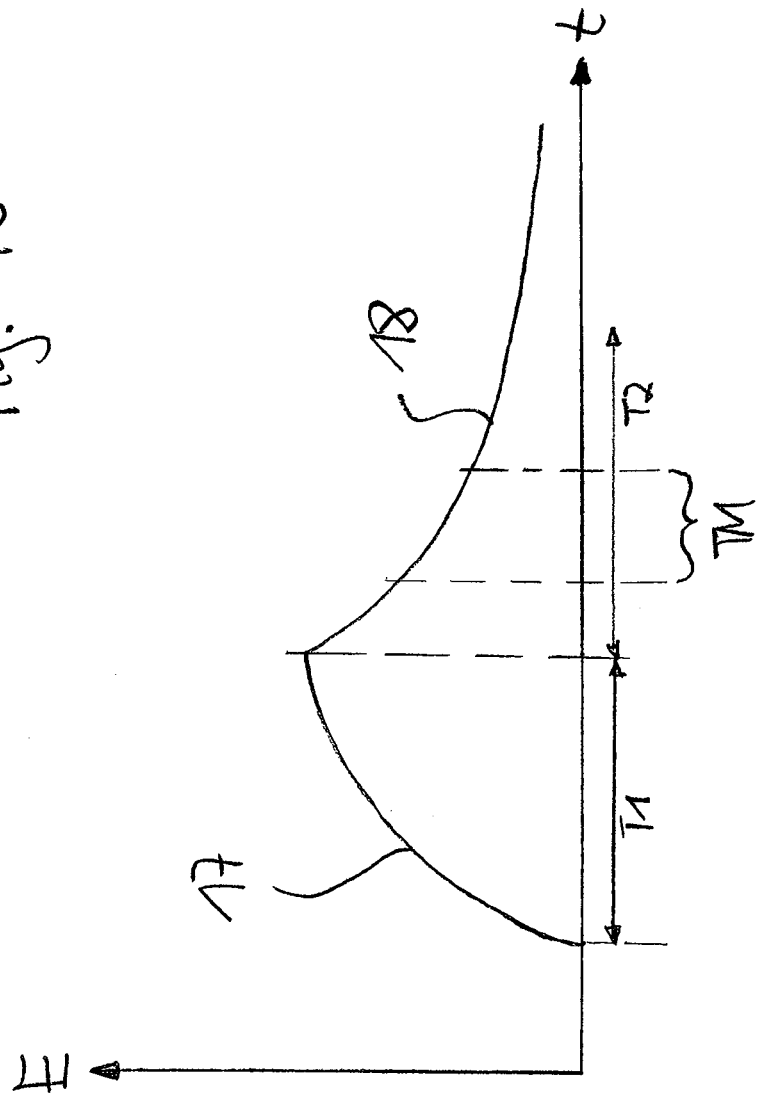

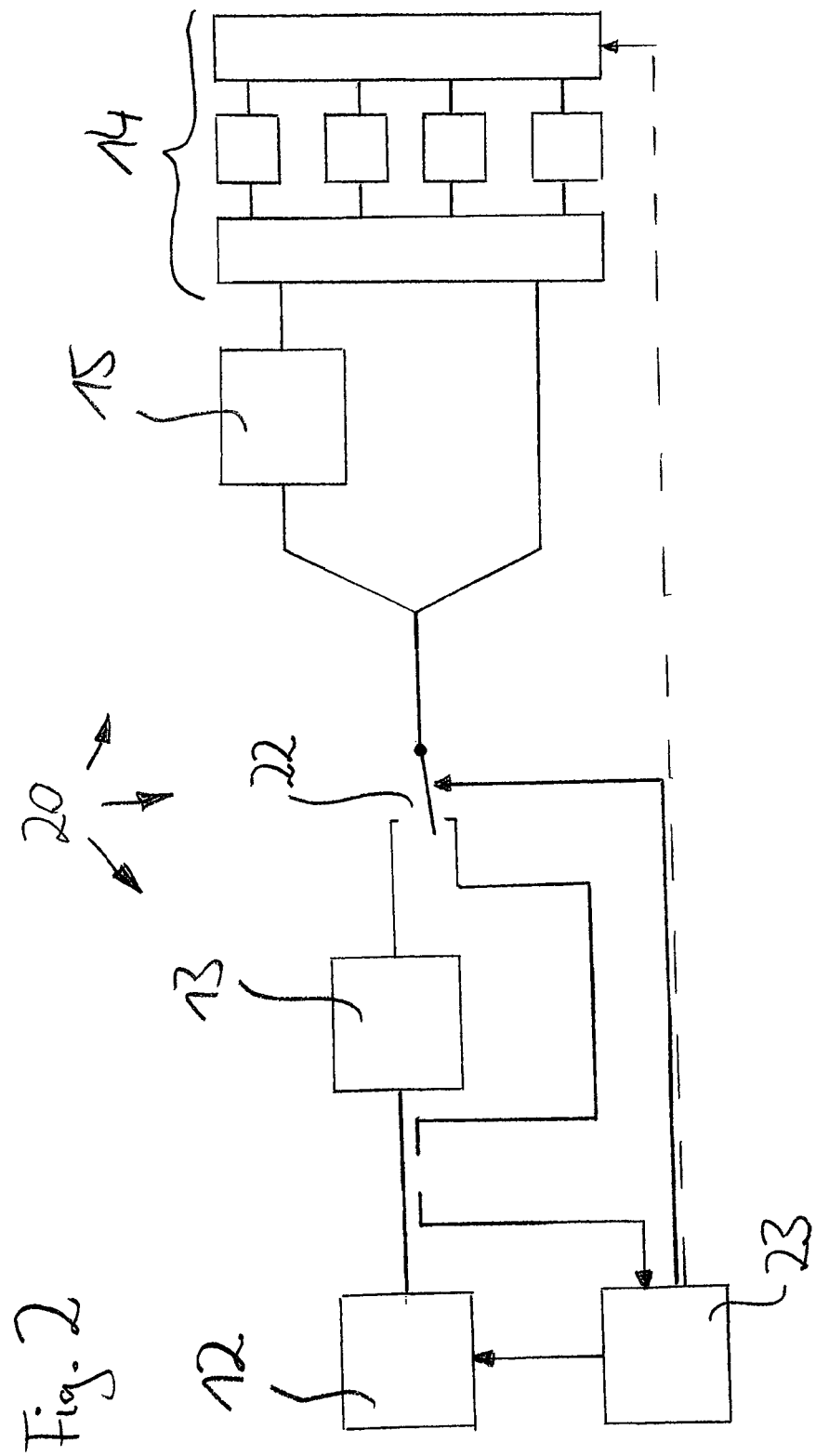

METHOD FOR MEASURING THE FREQUENCY OF AN ELECTRICAL SIGNAL AND AN ELECTRICAL MEASURING SYSTEM

PRIORITY STATEMENT

The present application hereby claims priority under 35 U.S.C. §119 to German patent application number DE 102013209364.0 filed May 21, 2013, the entire contents of which are hereby incorporated herein by reference.

FIELD

At least one embodiment of the invention generally relates to a method for measuring the frequency of an electrical signal, and/or a corresponding electrical measuring system.

BACKGROUND

The use of the so-called six-gate technology in the field of optical transmission technology, e.g. with coherent optical receivers, is known, for example, from the IEEE Publication "Multi-Port Technology for Microwave and Optical Communications" by I. Molina-Fernández et. al. According to the aforementioned IEEE Publication, an electrical signal with unknown frequency is transmitted to a six-gate circuit via a delay line. As a result of the delay line, the two signals are received with a phase difference at the six-gate circuit, which difference is proportional to the unknown frequency. This phase difference is detected by the six-gate circuit, so that the unknown frequency can be computed with the aid of the length for the delay line.

SUMMARY

At least one embodiment of the present invention improves the frequency measurement and/or its use options.

At least one embodiment of the invention is directed to a method for determining the frequency of an electrical signal. At least one embodiment of the invention is directed to a corresponding electrical measuring system.

With the method according to an embodiment of the invention and the measuring system according to an embodiment of the invention, the signal is transmitted on the one hand directly and on the other hand via a delay line to a six-gate circuit. The six-gate circuit computes the frequency of the signal in dependence on the length of the delay line, wherein the signal in this case is outputted by a resonator.

By generating the electrical signal with the aid of a resonator, the area of application for the six-gate circuit is expanded considerably. Thus, the six-gate circuit not only can be used in the field of optical transmission technology, as is the case according to the prior art, but also in other technical fields. With the use of a resonator, the six-gate technology can furthermore be used advantageously in the field of sensor technology.

If a so-called SAW resonator (SAW=surface acoustic wave) is used, this resonator generally outputs short and decaying response signals. In that case, the aforementioned six-gate technology is particularly suitable for evaluating the signals coming from the SAW resonator.

According to a modification of an embodiment of the invention, the frequency of the signal corresponds to a resonance frequency of the resonator which, among other things, can depend on the temperature and/or the pressure strain and/or the elongation to which the resonator is exposed. A change in the temperature and/or the pressure and/or the elongation of the resonator leads to a change in the resonator frequency which can be determined by the six-gate circuit. In this way, the six-gate technology can be used in connection with a temperature sensor or a pressure sensor or an elongation sensor.

According a different embodiment of the invention, an excitation signal is transmitted from an oscillator to the resonator. The resonator is thus charged with energy with the aid of the excitation signal. This energy can be released once more by the resonator, meaning via the electrical response-signal with the resonance frequency.

For yet another modification of an embodiment of the invention, the length of the delay line is determined for a known frequency, with the aid of the six-gate circuit. In this way, the six-gate technology is used multiple times, that is to say on the one hand for measuring an unknown frequency such as the resonance frequency of the resonator and, on the other hand, for measuring the unknown length of the delay line. With the aid of the last-named measurement, for example, temperature-dependent changes in the length of the delay line can be detected and taken into consideration.

For one embodiment of the invention, a changeover switch is arranged between the resonator and the six-gate circuit, such that either the oscillator output or the resonator output is connected to the six-gate circuit. In the first mentioned case, the six-gate circuit can be used to determine the length of the delay line and in the second-mentioned case it can be used to determine the unknown frequency of the electrical signal, for example the resonance frequency of the resonator.

BRIEF DESCRIPTION OF THE DRAWINGS

Additional features, use options and advantages of the invention follow from the description below of example embodiments of the invention which are shown in the Figures. All described or illustrated features either by themselves or in any combination thereof represent the subject matter of the invention, regardless of how they are summarized in the patent claims or the references back, as well as independent of their formulation and/or representation in the description and/or in the Figures.

FIG. 1a shows a schematic block diagram of a first example embodiment of an electrical measuring system according to the invention.

FIG. 1b shows a schematic diagram of a signal of the measuring system according to FIG. 1a.

FIG. 2 shows a schematic block diagram of a second example embodiment of an electrical measuring system according to the invention.

DETAILED DESCRIPTION OF THE EXAMPLE EMBODIMENTS

Figure 3:
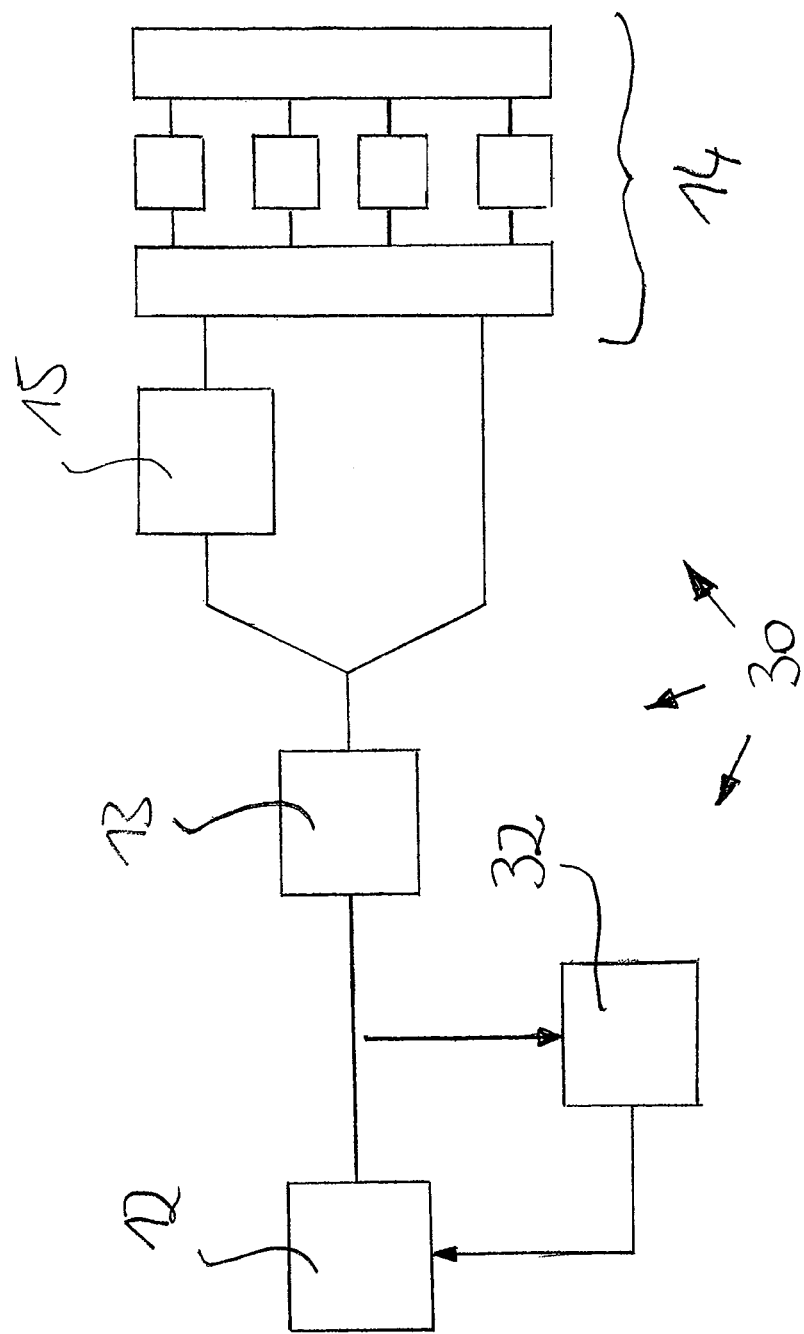
FIG. 3 shows a schematic block diagram of a third example embodiment of an electrical measuring system according to the invention.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

FIG. 1a illustrates an electrical measuring system 10, for which the so-called six-gate technology is used for the purpose of realizing the frequency measurement.

The measuring system 10 comprises an oscillator 12. The output signal from the oscillator 12 is a sine oscillation with changeable frequency and a specifiable amplitude. The change in the frequency can be controlled or regulated. In principle, the oscillator 12 can be embodied optionally. However, it is advantageous to use a so-called VCO (VCO=voltage controlled oscillator).

The measuring system 10 comprises a resonator 13. In principle, the resonator 13 can have an optional design. However, the resonator 13 is preferably a so-called SAW resonator and/or an AOW resonator (SAW=surface acoustic wave; AOW=acoustic surface wave). The resonator 13 in that case can be embodied as a single gate circuit or, as shown in FIG. 1a, as a double-gate circuit or, if applicable, also as a multi-gate circuit.

The resonator 13, as shown in FIG. 1a, comprises an input and an output and is provided at those locations with respectively one sound transducer, not shown herein. The sound transducers are intended for transducing an electrical signal into an associated sound wave and vice versa.

The resonator 13 has a surface structure which is arranged between the two sound transducers. The sound wave produced by one of the two sound transducers thus travels via the surface structure to the other sound transducer or vice versa.

The resonator 13 has a resonance frequency. If the resonator 13 is admitted via its input with an excitation signal that does not have the resonance frequency, then the excitation signal is not accepted by the resonator 13 and/or it is bounced back to its input. However, if the resonator 13 is admitted with an excitation signal which essentially has the resonance frequency, the resonator 13 is charged with energy by that share of the signal which has the resonance frequency.

With a SAW resonator, the energy introduced into the resonator 13 is then stored in the form of a mechanical surface wave.

As soon as the resonator 13 is charged with energy, the energy existing in the resonator 13 is released again, following the stopping of the excitation signal, by way of the resonator 13 output and in the form of a decaying response signal with resonance frequency.

The resonance frequency of the resonator 13 can be influenced by a corresponding design of the surface structure of the resonator 13 and can thus be adjusted ahead of time. However, the resonance frequency also depends on additional marginal conditions that influence the resonator 13, for example the temperature, the pressure and/or the elongation, to which in particular the surface structure of the resonator 13 is subjected.

Thus, if the temperature and/or the pressure and/or the elongation of the resonator 13 change, this results in a change in the resonance frequency of the resonator 13. A conclusion relating to the change in the temperature and/or the pressure and/or the elongation can therefore be drawn with the aid of a resonance-frequency measurement.

The input of the resonator 13 is connected to the output of the oscillator 12. The aforementioned excitation signal can therefore be generated as desired by the oscillator 12 and can be transmitted to the resonator 13. As a result, the previously mentioned response signal is present at the output of the resonator 13.

The measuring system 10 comprises a six-gate circuit 14 and a delay line 15, wherein the latter represents a length d. The resonator 13 output is connected to the six-gate circuit 14, that is on the one hand directly and, on the other hand, via the delay line 15.

The six-gate circuit 14 can be configured in different ways. As example therefor, we point to the aforementioned IEEE Publication "Multi-Port Technology for Microwave and Optical Communications," the entire contents of which are hereby incorporated herein by reference.

According to the representation in FIG. 1a, the six-gate circuit 14 not only comprises passive components, but also has active components. Among other things, the six-gate circuit 14 can be provided with a digital controller.

The delay line 15 can also be configured in different ways. As example therefor, we point to the aforementioned IEEE Publication "Multi-Port Technology for Microwave and Optical Communications," the entire contents of which are hereby incorporated herein by reference. The delay line 15 can preferably be embodied as SAW component, that is to say by utilizing acoustic surface waves.

In the following, we proceed on the assumption that the length of the delay line 15 is known.

During the operation of the measuring system 10, the oscillator 12 generates the excitation signal in such a way that energy is released by the oscillator 12 at the resonance frequency of the resonator 13.

This can be achieved, for example, with the following methods, wherein the assumption is made that the resonance frequency of the resonator 13 is known, at least as an approximate value. As mentioned in the above, the resonance frequency of a SAW resonator in particular depends on the surface structure of said resonator.

The frequency of the excitation signal in that case can be selected such that it is at least close to the resonance frequency. Supplementally, the frequency of the excitation signal can be changed in such a way in the broad-band or narrow-band that the excitation signal covers the resonance frequency with a high probability. Alternatively or in addition thereto, it is furthermore possible to determine the resonance frequency in some way and then use it as the frequency of the excitation signal.

As previously explained, the excitation signal is then transmitted to the resonator 13 and the resonator 13 is thus charged with energy.

As explained before, the response signal is outputted following the charging of the resonator 13. Even after the excitation signal is no longer present at the resonator 13, the resonator 13 releases the charged energy, at least for a certain period of time, in the form of a response signal with the resonance frequency. The resonance frequency in this case depends on the temperature and/or the pressure and/or the elongation of the resonator 13 and is therefore not known.

The energy E of the excitation signal and the response signal is plotted over the time t in FIG. 1b. The course of the energy, introduced into the surface structure of the resonator 13 by the excitation signal, is characterized with the reference 17 in FIG. 1b. The course of the energy for the excitation signal extends in this case over a time period T1, which essentially corresponds to the duration of the excitation signal.

The reference 18 denotes the course of the energy, which is released again from the surface structure of the resonator 13 in the form of the response signal once the excitation signal is stopped. The response signal is decaying and essentially has the resonance frequency. The time period T2 for the course of the energy of the response signal is not important for the present case and is therefore not shown further in FIG. 1b. The time period T2, however, is selected such that at least one measuring interval TM exists, within which a processing of the response signal is realized by the six-gate circuit 14.

Within the measuring interval TM, the response signal is processed by the six-gate circuit 14. As previously mentioned, the six-gate circuit 14 in the process receives the response signal either directly or indirectly via the delay line 15, wherein the response signal has an unknown resonance frequency, as previously explained as well. This resonance frequency is given the reference fx in the following and is correspondingly drawn into the FIG. 1a.

The two signals received at the six-gate circuit 14 have the resonance frequency fx. The delay line 15 does not cause a change in the resonance frequency fx. Owing to the delay line 15, however, the two signals arrive at a phase difference dφ which is proportional to the unknown resonance frequency fx. The phase difference dφ is measured and/or determined by the six-gate circuit 14. The six-gate circuit 14 subsequently computes the unknown resonance frequency fx by using the length d of the delay line 15.

The computing of the resonance frequency fx can be realized in different ways.

For example, the resonance frequency fx can be computed on the basis of the following equation:

$$fx = d\phi \cdot c'/d \cdot 2\pi$$

wherein c' represents the speed for the propagation of the signals in the resonator 13.

The above equation can be derived, for example, from the general equation $U(s) = U_h \cdot e^{-j\beta s}$ for a high-frequency line, wherein the following applies:

$\beta = 2\pi/\lambda$ and $\lambda = c'/f$. Since only the phase difference thp is of importance in this case, the following is obtained from the exponents: $d\phi = \beta \cdot s = 2\pi \cdot f \cdot s/c'$. With s=d, the following equation results: $f = d\phi \cdot c'/d \cdot 2\pi$.

As previously mentioned, a conclusion can then be drawn concerning the change in the temperature and/or the pressure and/or the elongation, which influence the resonator 13, based on the determined resonance frequency fx. The measuring system 10 can thus be used at least for measuring the temperature or the pressure or the elongation.

FIG. 2 shows an electrical measuring system 20, configured at least in part similar to the measuring system 10 shown in FIG. 1a, which is why in the following only the differences between the measuring system 20 shown in FIG. 2 as compared to the measuring system 10 shown in FIG. 1a are described. Otherwise and in view of the explanations provided below for the measuring system 20 in FIG. 2, we always refer to the above-provided explanations to FIGS. 1a, 1b.

With the measuring system 20 according to FIG. 2, a changeover switch 22 is provided between the resonator 13 and the six-gate circuit 14. At the joint terminal, the changeover switch 22 is connected to the six-gate circuit 14, meaning on the one hand directly and on the other hand via the delay line 15. At the two separate changeover terminals, the changeover switch 22 is connected on the one hand to the resonator 13 output and on the other hand to the oscillator 12 output.

To connect the changeover switch 22 to the oscillator 12 output, a forward direction coupler can be provided, for example as shown in FIG. 2. We want to point out that the aforementioned coupling can also be realized differently.

The measuring system 20 can furthermore comprise a control 23 which can be used to influence the oscillator 12. The control 23 together with the oscillator 12 preferably forms a so-called PLL circuit (PLL=phase locked loop).

The control 23 is designed such that it can be used to preset a changeable frequency for the excitation signal generated by the oscillator 12. In particular, the frequency can be increased or reduced in predeterminable steps incrementally. The frequency of the excitation signal respectively generated by the oscillator 12 is thus known.

The control 23 is connected to the input of the resonator 13, for example by realizing it with the aid of a forward direction coupler, as shown. The control 23 is designed such that it can be used to detect whether or not the excitation signal outputted by the oscillator 12 and sent to the resonator 13 is accepted by the resonator 13 and/or is bounced back to its input. The control 23 can be provided for this with a known power detector, for example with a so-called diode detector.

With the aid of the control 23, it is thus possible to detect whether or not the frequency of the excitation signal that is generated by the oscillator 12 is in the range of the resonance frequency. If the frequency of the excitation signal is not in the range of the resonance frequency, the excitation signal essentially is not accepted by the resonator 13 and is instead bounced back to the output of the oscillator 12. However, if the frequency of the excitation signal is in the range of the resonance frequency, the excitation signal is accepted by the resonator 13 and is therefore not bounced back to the oscillator 12 output.

The control 23 is provided for controlling the switching state of the changeover switch 22, meaning to switch back and forth between two states of the switch 22. It is furthermore possible for the control 23 to transmit information to the six-gate circuit 14 via the oscillator 12 and/or the changeover switch 22. For example, the control 23 can pass to the six-gate circuit 14 information relating to the actual frequency of the excitation signal which is generated by the oscillator 12 and/or the actual switching state of the changeover switch 22.

During the operation of the measuring system 20, the oscillator 12 generates the excitation signal in the form of a sine-shaped signal. In the process, the frequency of this signal is changed from a lower value to an upper value or vice versa. The lower and the upper values are selected such that the resonance frequency of the resonator 13 is within the frequency range, formed in this way, of the excitation signal.

At the start of the procedure, the changeover switch 22 is switched by the control 23 to the switching state where the output of the oscillator 12 is connected to the six-gate circuit 14, wherein this is synonymous with the resonator 13 output being open.

The excitation signal that is present with a known, constant frequency is thus fed via the changeover switch 22 to the six-gate circuit 14. In this state, the length of the delay line can then be calibrated.

With a selectable frequency f1 for the excitation signal, which need not be in the range of the resonance frequency of the resonator 13, the six-gate circuit 14 then realizes a computation as follows. It is assumed that the frequency f1 can be preset with the aid of the control 23, that the value is transmitted to the six-gate circuit 14 and that the length of the delay line 15 is not known. This unknown length is henceforth characterized with the reference dx.

The two signals received at the six-gate circuit 14 are both received with the preset frequency f1. The delay line 15 does not cause a change in this frequency f1. However, as a result of the delay line 15, the two signals have a phase difference dφ. The phase difference dφ is measured and/or determined by the six-gate circuit 14. The six-gate circuit 14 then computes the unknown length dx of the delay line 15 with the aid of the frequency f1.

Computing the length dx, for example, can be realized on the basis of the following equation:

$$dx = d\phi \cdot c'/f1 \cdot 2\pi$$

wherein c' represents the speed for the propagation of the signals in the resonator 13.

Reference is made to the fact that the excitation signal can also be present in the form of several different frequencies, successively present, which are respectively constant and known. In particular, this may be the case if the explained calibration results in several solutions.

Once the calibration of the delay line length is completed, the control 23 moves the changeover switch 22 to the switching state where the resonator 13 output is connected to the six-gate circuit 14. As a result, the response signal of the resonator 13 is transmitted to the six-gate circuit 14.

The state of the measuring system 20 in FIG. 2 now corresponds essentially to that of the measuring system 10 in FIG. 1b.

The oscillator 12, in turn, generates the excitation signal in such a way that the oscillator 12 releases energy at the resonance frequency of the resonator 13, wherein this can be realized on the basis of the previously explained methods.

The response signal from the resonator 13 is processed by the six-gate circuit 14 within the measuring interval TM. The six-gate circuit 14 in the process receives the response signal either directly or indirectly via the delay line 15. The two signals received at the six-gate circuit 14 both arrive with the unknown resonance frequency fx. However, owing to the delay line 15, the phase difference between the two signals is dφ. The phase difference dφ is measured and/or determined by the six-gate circuit 14. The six-gate circuit 14 then computes the resonance frequency fx with the aid of the previously determined length dx of the delay line 15. This can be realized, for example, with the aid of the previously discussed equation: fx=dφ·c'/dx·2π.

We want to point out that the calibration of the delay line length can be repeated. In that case, the calibration and the frequency determination can be carried out alternately.

FIG. 3 shows an electrical measuring system 30 which, at least in part, is configured similar to the measuring system 10 in FIG. 1a or the measuring system 20 according to FIG. 2. In the following, only the differences are therefore described for the measuring system 30 in FIG. 3 as compared to the measuring system 10 in FIG. 1a and/or the measuring system 20 in FIG. 2. With respect to the following explanations for the measuring system 30 in FIG. 3, reference is otherwise always made to the above explanations relating to FIGS. 1a, 1b and FIG. 2.

The measuring system 30 is provided with a circuit 32 that is connected to the input of the resonator 13. At least a corresponding directional coupler can be provided for this, for example as shown in FIG. 3. The circuit 32 is intended to influence the oscillator 12.

The circuit 32 is embodied such that it can detect whether or not the excitation signal sent from the oscillator 12 to the resonator 13 input is accepted or is bounced back to its input. The circuit 32 can be provided for this with a power detector according to the prior art.

In general, the circuit 32 can be embodied such that it can detect to what degree the excitation signal, sent from the oscillator 12 to the resonator 13 input, is bounced back again by the resonator 13 to its input.

For example, the circuit 32 can be laid out such that it can be used with any optional method for measuring a so-called standing wave ratio (VSWR=voltage standing wave ratio). In that case it is determined which share of the energy introduced into the resonator 13 is reflected again by the resonator 13.

It is now assumed that the length d of the delay line 15 is known. The length d in that case can be determined ahead of time with the aid of a calibration, for example, as explained previously in connection with the measuring system 20 shown in FIG. 2.

During the operation of the measuring system 30, the oscillator 12 generates the excitation signal in the form of a sine-shaped signal. The frequency of this signal is changed from a lower value to an upper value or vice versa. The lower and the upper value in that case are selected such that the resonance frequency of the resonator 13 is within the frequency range of the excitation signal formed in this way. The change in frequency can occur in discrete steps or increments, meaning digital or linear and/or analogous.

The circuit 32 now detects continuously the state in which the excitation signal sent from the oscillator 12 to input of the resonator 13 is accepted by the resonator 13 and/or is bounced back again to its input. The oscillator 12 is informed of this state as soon as it exists. The oscillator 12 then changes the frequency of the excitation signal only to a slight degree, so that the detected state essentially is maintained.

On the whole, the frequency of the excitation signal is thus adjusted continuously with the aid of the circuit 32 for the resonance frequency of the resonator 13.

As a result, the frequency of the excitation signal is essentially always in the range of the resonance frequency.

We want to point out that the aforementioned frequency of the excitation signal does not have to be known.

Since the frequency of the excitation signal is in the range of the resonance frequency, the resonator 13 is charged continuously with energy, wherein this consequently results in a continuous release of energy in the form of the response signal from the resonator 13. The resonance frequency of this response signal can differ from the excitation signal frequency and is therefore not known.

As previously explained, the response signal is then processed by the six-gate circuit 14. This processing does not have to occur within the measuring interval TM, explained in connection with FIG. 1b, since energy is released continuously in the form of the response signal from the resonator 13.

During the processing, the six-gate circuit 14 receives the response signal directly as well as indirectly via the delay line 15. The two signals arrive with the unknown resonance frequency fx at the six-gate circuit 14. Owing to the delay line 15, the two signals arrive with the phase difference dφ. The phase difference dφ is measured and/or determined by the six-gate circuit 14. The six-gate circuit 14 then computes the resonance frequency fx with the aid of the known length d for the delay line 15, wherein this can be realized with the aid of the previously explained equation: fx=dφ·c'/d·2π.

As explained before, the switching takes place between the above-explained frequency measurement and the aforementioned calibration, which can be realized as explained with the aid of FIG. 2. The calibration and the frequency determination can furthermore be repeated alternating.

Figure 4:
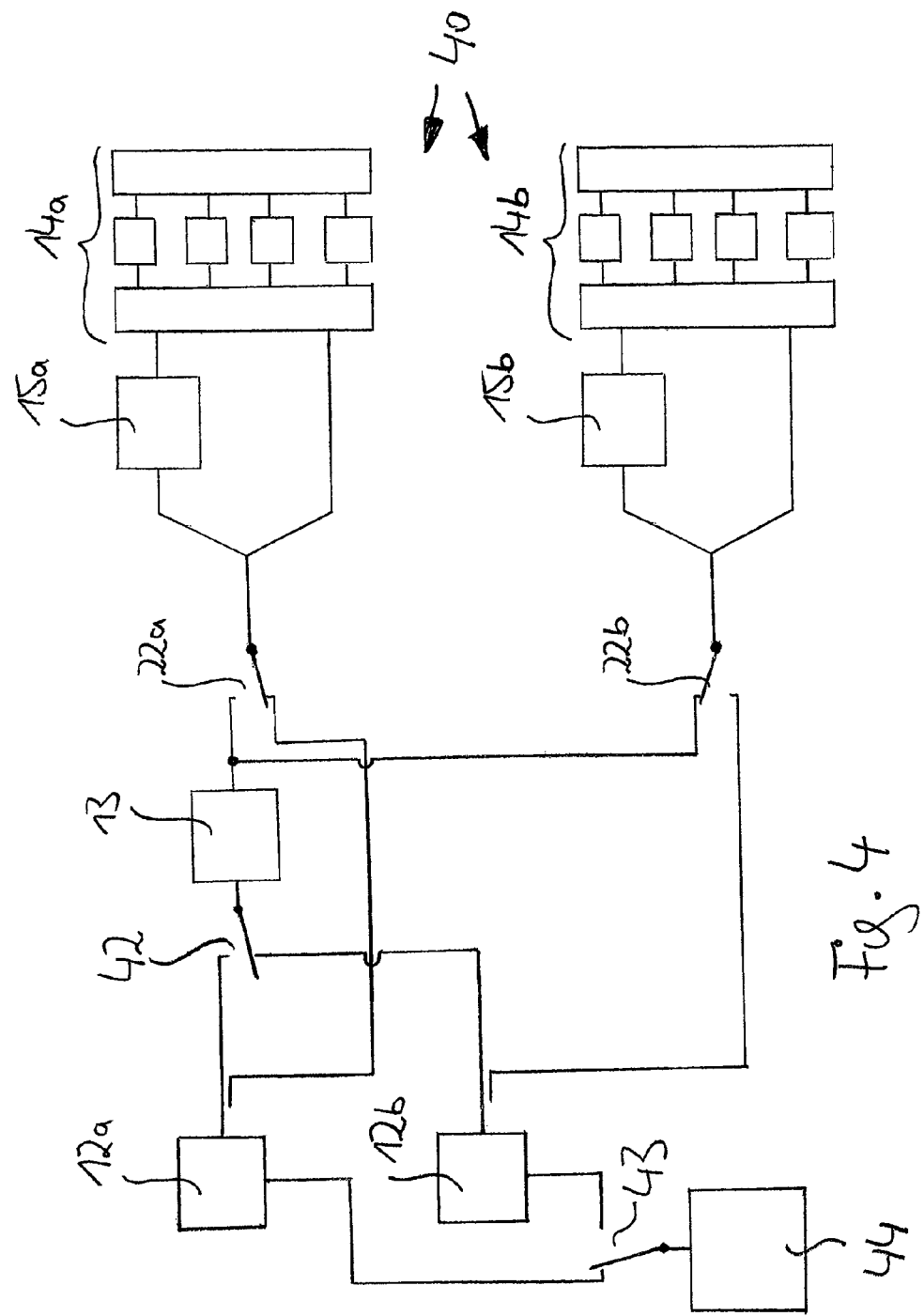
FIG. 4 shows a schematic block diagram of a fourth example embodiment of a measuring system according to the invention.

FIG. 4 shows an electrical measuring system 40 which is configured at least in part similar to the measuring system 20 in FIG. 2. For that reason, only the differences are described in the following for the measuring system 40 in FIG. 4, as compared to the measuring system 10 in FIG. 1a and/or the measuring system 20 in FIG. 2. In view of the following explanations for the measuring system 40 in FIG. 4, reference is otherwise always made to the above-provided explanations to FIGS. 1a, 1b and to FIG. 2.

For the measuring system 40 in FIG. 4, the measuring system 20 from FIG. 2 is at least in part embodied twice, thereby resulting in two for the most part identical partial systems. The components of the two partial systems are characterized in FIG. 4 with the additional references "a" and "b." Each of the partial systems comprises an oscillator 12a, 12b, a delay lines 15a, 15b, a six-gate circuit 14a, 14b and a changeover switch 22a, 22b. The two partial systems are essentially connected parallel to each other.

The resonator 13, however, exists only once. Arranged at the input of the resonator 13 is a changeover switch 42, the joint terminal of which is connected to the resonator 13 and the two changeover terminals of which are connected to the two oscillators 12a, 12b.

The two oscillators 12a, 12b are connected to the changeover terminals of an additional changeover switch 43 for which the joint terminal is connected to an electrical circuit 44. The electrical circuit 44 preferably comprises a counter.

The measuring system 40 in FIG. 4 is operated in such a way that one of the two partial systems is always used for the calibration and the respectively other partial system is used for measuring the frequency, wherein this is achieved with the corresponding switching positions of the changeover switches 22a, 22b, 42 and 43.

For example, it is possible that the upper partial system in FIG. 4, which includes the oscillator 12a, the delay line 15a, the six-gate circuit 14a and the changeover switch 22a, is used for calibrating the length of the delay line 15a. The lower partial system, including the oscillator 12b, the delay line 15b, the six-gate circuit 14b and the changeover switch 22b, is then used for measuring the unknown frequency. The changeover switches 22a, 22b, as well as the changeover switches 42, 43, are switched in that case to the positions shown in FIG. 4.

Owing to the position of the changeover switch 43, shown in FIG. 4, the signal outputted by the oscillator 12a is transmitted to the electrical circuit 44 where this signal can be evaluated, for example, with the aid of the aforementioned counter. In this way, the frequency of the signal generated by the oscillator 12a can be determined. As previously explained, the length dx of the delay line 15a is determined by the six-gate circuit 14a during the calibration on the basis of this frequency.

Owing to the option of providing a relatively long measuring period for the aforementioned frequency measuring, the accuracy of the frequency measurement can thus be increased considerably, in particular in view of the evaluation with the aid of the counter.

Once this calibration is completed, the changeover switches 22a, 22b, 42, 43 are moved back to the position which is not shown in FIG. 4. As a result, the lower partial system shown in FIG. 4, which includes the oscillator 12b, the delay line 15b, the six-gate circuit 14b and the changeover switch 22b, is now used for the calibration of the length of the delay line 15b while the upper partial system, including the oscillator 12a, the delay line 15a, the six-gate circuit 14a and the changeover switch 22a, is then used for measuring the unknown frequency. In the process, the length dx of the delay line 15a, determined by the upper partial system during the preceding calibration, is used for computing the frequency.

The above-explained alternating use of the two partial systems can be repeated continuously. It means that always one of the two partial systems is available for computing the unknown frequency on the basis of the last realized calibration and that the other partial system carries out a new calibration of the length of the associated delay line.

It is understood that the measuring system 40 in FIG. 4 can be provided with corresponding controls and/or circuits which are necessary for realizing the above-explained methods and which have been explained in a comparable manner in connection with FIGS. 1a and 2.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Although the invention has been illustrated and described in detail on the basis of the preferred example embodiment, the invention is not limited by the disclosed examples and other variations can be derived herefrom by the person skilled in the art, without departing from the scope of protection of the invention.

What is claimed is:

1. A method for determining a frequency of an electrical signal, comprising:
   generating the electrical signal with the aid of a resonator, the resonator being fed an excitation signal by an oscillator;
   controlling a changeover switch between the resonator and a six-gate circuit to connect an output of the resonator to the six-gate circuit directly and via a delay line;
   sending the electrical signal directly, and via the delay line, to the six-gate circuit; and
   computing, at the six-gate circuit, the frequency of the electrical signal in dependence of a length of the delay line.

2. The method of claim 1, wherein the frequency of the electrical signal corresponds to a resonance frequency of the resonator, which depends on at least one of a temperature, pressure and elongation to which the resonator is subjected.

3. The method of claim 1, wherein a frequency of the excitation signal is selected such that the frequency comes at least close to the resonance frequency.

4. The method of claim 3, wherein the frequency of the excitation signal is changed, either wide-band or narrow-band, such that the excitation signal covers the resonance frequency with a relative maximum possible probability.

5. The method of claim 1, further comprising:
at least one of detecting whether the excitation signal outputted by the oscillator is not accepted by the resonator, and bouncing the excitation signal back to its input, wherein
the frequency of a measuring signal is computed by the six-gate circuit during a measuring interval, during which the excitation signal outputted by the oscillator is at least one of not accepted by the resonator and bounced back to its input.

6. The method of claim 5, wherein the excitation signal is turned off during the measuring interval.

7. The method of claim 1, further comprising:
at least one of detecting whether the excitation signal outputted by the oscillator is not accepted by the resonator, and bouncing the excitation signal back to its input, wherein
the frequency of the excitation signal is adjusted such that the excitation signal is accepted continuously, if possible, by the resonator.

8. The method of claim 7, wherein the frequency of the electrical signal is computed continuously by the six-gate circuit.

9. The method of claim 1, wherein, with a known frequency, the length of the delay line is determined with the aid of the six-gate circuit.

10. An electrical measuring system comprising:
a resonator configured to output an electrical signal;
a six-gate circuit;
a delay line, wherein the resonator is configured to output the electrical signal directly, and via the delay line, to the six-gate circuit, and wherein the six-gate circuit is configured to compute a frequency of the electrical signal in dependence of a length of the delay line;
an oscillator connected to the resonator, the oscillator configured to feed an excitation signal to the resonator; and
a changeover switch between the resonator and the six-gate circuit, the changeover switch configured to connect either an output of the oscillator or an output of the resonator to the six-gate circuit.

11. The measuring system of claim 10, wherein the resonator comprises:
at least one sound transducer and a surface structure to which a resonance frequency is assignable, the resonance frequency being dependent on at least one of a temperature, pressure and an elongation to which the resonator is subjected.

12. The measuring system of claim 10, further comprising:
a control or a circuit, connected to the resonator and configured to influence the oscillator.

13. The measuring system of claim 10, further comprising:
a control or a circuit, connected to the resonator and configured to influence the oscillator and the changeover switch.

14. The measuring system of claim 12, wherein the control or the circuit comprises a power detector.

15. The method of claim 1, wherein the method is used for measuring a temperature, a pressure or an elongation.

16. The method of claim 1, wherein the resonator is fed the excitation signal by the oscillator, which is separate from the resonator.

17. The measuring system of claim 10, wherein the resonator is separate from the oscillator.

* * * * *